United States Patent
Kim et al.

(10) Patent No.: US 11,640,944 B2
(45) Date of Patent: May 2, 2023

(54) SEMICONDUCTOR DEVICE AND METHOD OF FORMING A SLOT IN EMI SHIELDING LAYER USING A PLURALITY OF SLOT LINES TO GUIDE A LASER

(71) Applicant: STATS ChipPAC Pte. Ltd., Singapore (SG)

(72) Inventors: ChangOh Kim, Incheon (KR); JinHee Jung, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 32 days.

(21) Appl. No.: 17/307,437

(22) Filed: May 4, 2021

(65) Prior Publication Data
US 2022/0359417 A1    Nov. 10, 2022

(51) Int. Cl.
*H01L 23/552* (2006.01)
*H01L 21/48* (2006.01)

(52) U.S. Cl.
CPC ........ *H01L 23/552* (2013.01); *H01L 21/4814* (2013.01)

(58) Field of Classification Search
CPC .......................... H01L 23/552; H01L 21/4814
USPC ......................................................... 257/659
See application file for complete search history.

(56) References Cited

U.S. PATENT DOCUMENTS

| | | | |
|---|---|---|---|
| 9,070,793 B2 | 6/2015 | Liao et al. | |
| 9,129,954 B2 | 9/2015 | Yen et al. | |
| 9,144,183 B2 | 9/2015 | Chen et al. | |
| 9,153,542 B2 | 10/2015 | Lin et al. | |
| 2016/0008923 A1* | 1/2016 | Astle | B24C 3/322 427/555 |
| 2020/0161252 A1* | 5/2020 | Yang | H01L 23/552 |

* cited by examiner

*Primary Examiner* — Didarul A Mazumder
(74) *Attorney, Agent, or Firm* — Robert D. Atkins; Patent Law Group: Atkins and Associates, P.C.

(57) ABSTRACT

A semiconductor device has a shielding layer over a semiconductor package. A plurality of slot lines define a location to form a slot in the shielding layer. The slot is formed in the shielding layer by cutting along the slot lines with a laser controlled by a scanner to read the slot lines. The slot lines include a left boundary slot line and right boundary slot line. The slot can be cut in the shielding layer by performing an edge cut along the slot lines, and performing a peel back to form the slot in the shielding layer. Alternatively, the slot can be cut in the shielding layer by performing a first cut in a first direction along the slot lines, and performing a second cut in a second direction opposite the first direction along the slot lines to form the slot in the shielding layer.

31 Claims, 13 Drawing Sheets

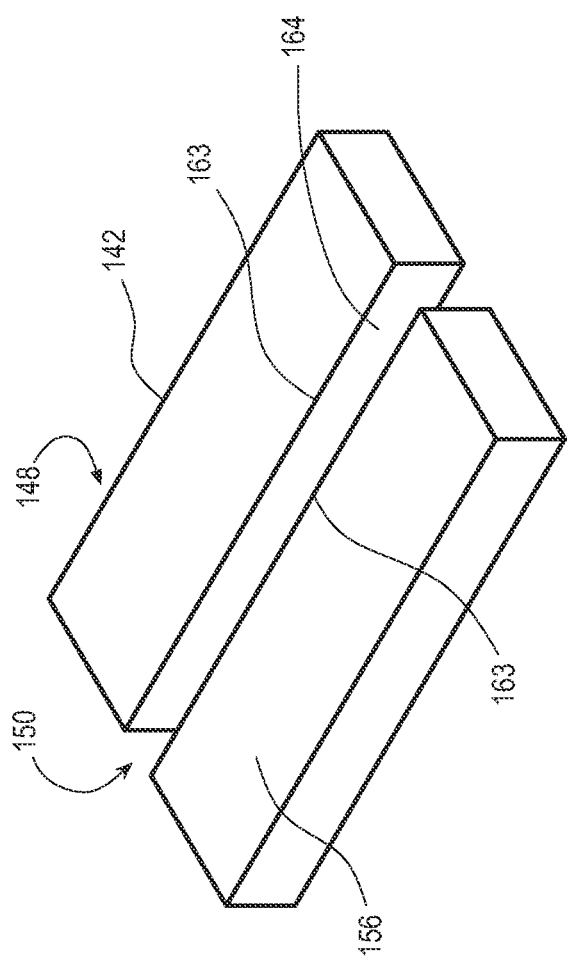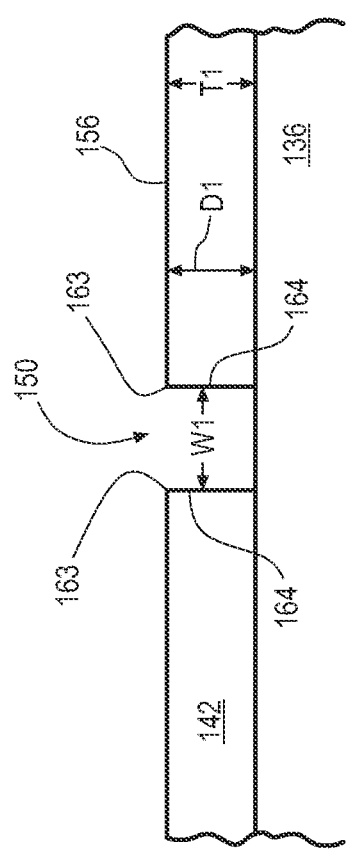
FIG. 3d
FIG. 3e

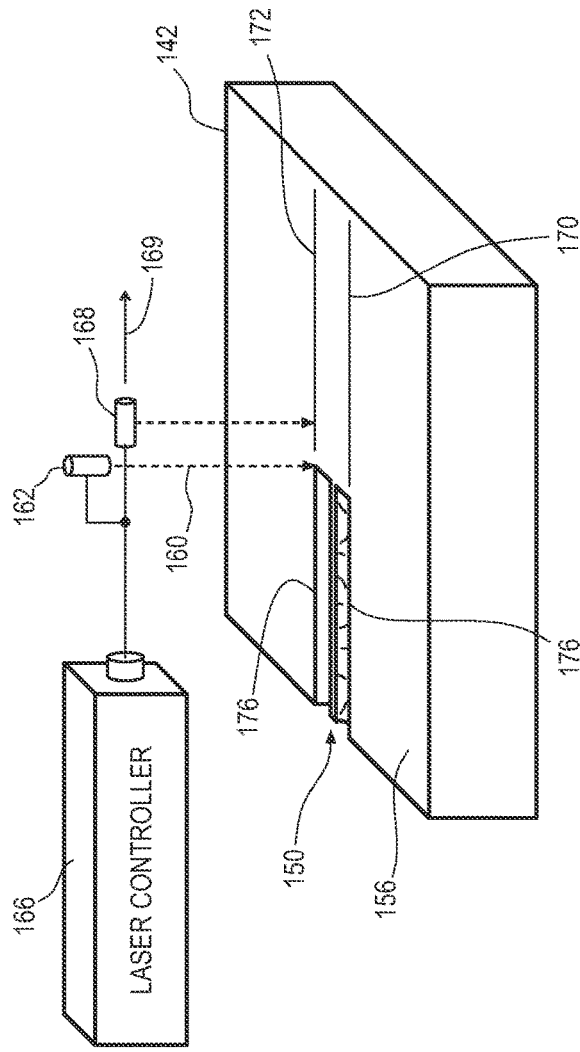
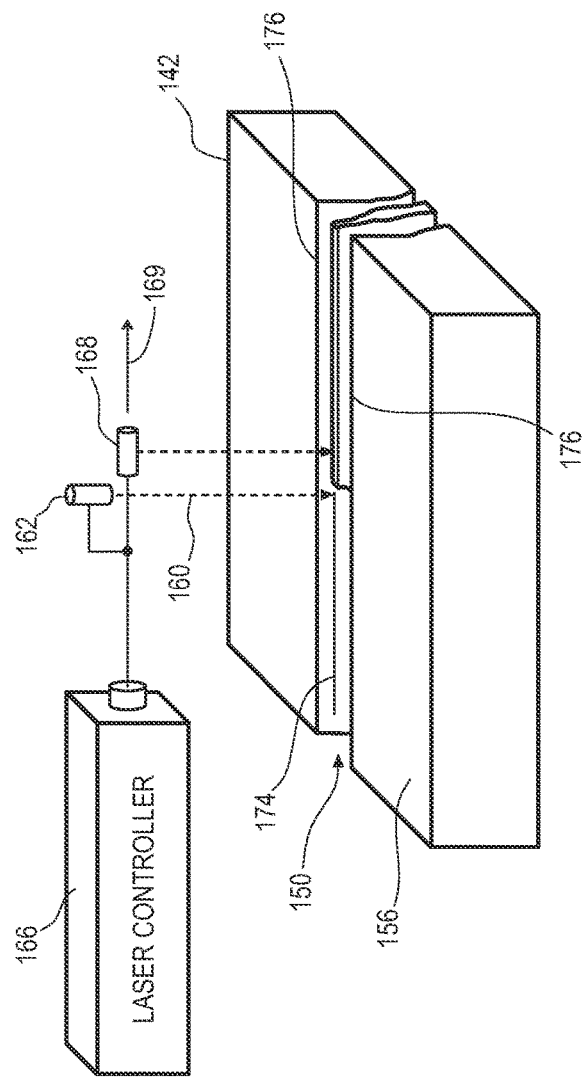

US 11,640,944 B2

SEMICONDUCTOR DEVICE AND METHOD OF FORMING A SLOT IN EMI SHIELDING LAYER USING A PLURALITY OF SLOT LINES TO GUIDE A LASER

FIELD OF THE INVENTION

The present invention relates in general to semiconductor devices and, more particularly, to a semiconductor device and method of forming a slot in an electromagnetic shielding layer over electrical components in a system-in-package (SiP) module using a plurality of slot lines to guide a laser.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices, particularly in high frequency applications, such as radio frequency (RF) wireless communications, often contain one or more integrated passive devices (IPDs) to perform necessary electrical functions. Multiple semiconductor die and IPDs can be integrated into an SiP module for higher density in a small space and extended electrical functionality. Within the SIP module, semiconductor die and IPDs are mounted to a substrate for structural support and electrical interconnect. An encapsulant is deposited over the semiconductor die, IPDs, and substrate. An electromagnetic shielding layer is commonly formed over the encapsulant.

The SIP module includes high speed digital and RF electrical components, highly integrated for small size and low height, and operating at high clock frequencies. The electromagnetic shielding layer reduces or inhibits EMI, RFI, and other inter-device interference, for example as radiated by high-speed digital devices, from affecting neighboring devices within or adjacent to SIP module. However, a conformally applied electromagnetic shielding layer by itself may not be effective against EMI loop currents within the shielding material. The EMI current loops can originate from high energy/output devices, such as a power amplifier embodied in one or more of the electrical components. The EMI loop currents flow through the electromagnetic shielding layer and induce EMI, RFI, and other inter-device interference in sensitive neighboring components within or adjacent to the SIP module.

BRIEF DESCRIPTION OF THE DRAWINGS

FIGS. 3a-3e illustrate a process of forming a slot in the surface of the electromagnetic shielding layer using multiple slot lines to guide a laser;

FIGS. 6a-6b illustrate the laser controller and scanner to follow the multiple slot lines to guide the laser;

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
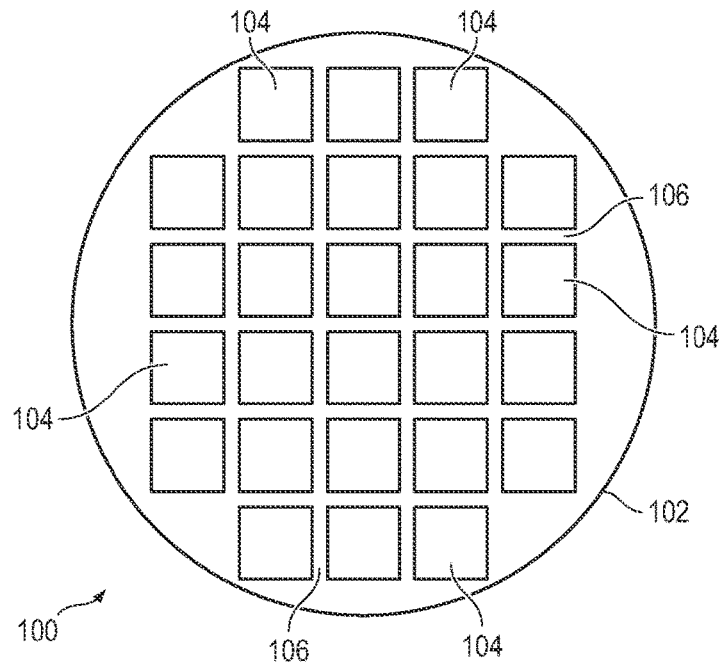
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
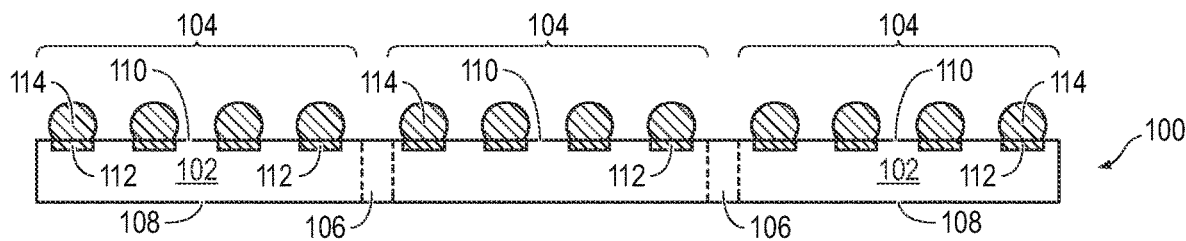

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), power amplifier, application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
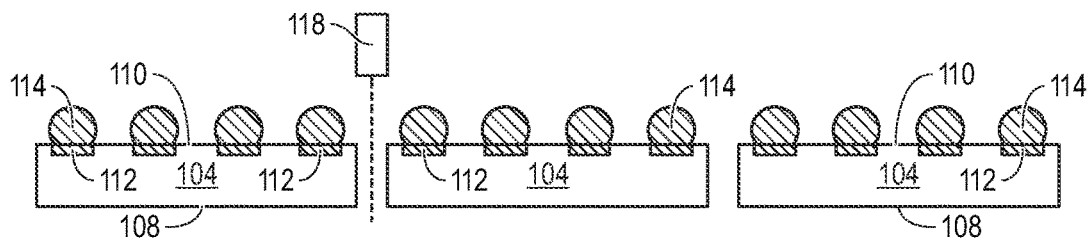

In FIG. 1c, semiconductor wafer 100 is singulated through saw street 106 using a saw blade or laser cutting tool 118 into individual semiconductor die 104. The individual semiconductor die 104 can be inspected and electrically tested for identification of KGD post singulation.

Figure 2A:
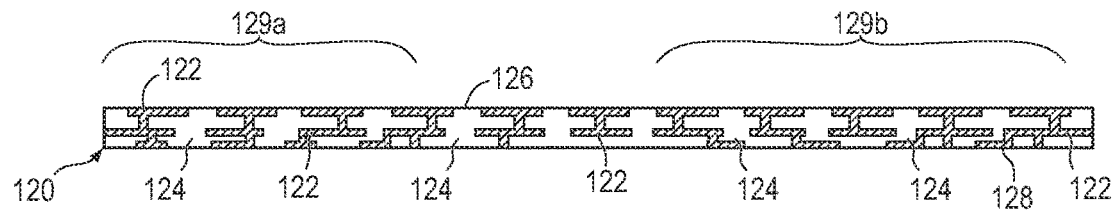
FIGS. 2a-2k illustrate a process of disposing electronic components on a substrate in an SIP with a slotted electromagnetic shielding layer.

FIGS. 2a-2k illustrate a process of disposing electrical components over an interconnect substrate to form an SIP module with a slotted electromagnetic shielding layer. FIG. 2a shows a cross-sectional view of interconnect substrate 120 including conductive layers 122 and insulating layer 124. Conductive layer 122 can be one or more layers of Al, Cu, Sn, Ni, Au, Ag, or other suitable electrically conductive material. Conductive layer 122 provides horizontal electrical interconnect across substrate 120 and vertical electrical interconnect between top surface 126 and bottom surface 128 of substrate 120. Portions of conductive layer 122 can be electrically common or electrically isolated depending on the design and function of semiconductor die 104 and other electrical components. Insulating layer 124 contains one or more layers of silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBO), and other material having similar insulating and structural properties. Insulating layer 124 provides isolation between conductive layers 122.

Figure 2B:
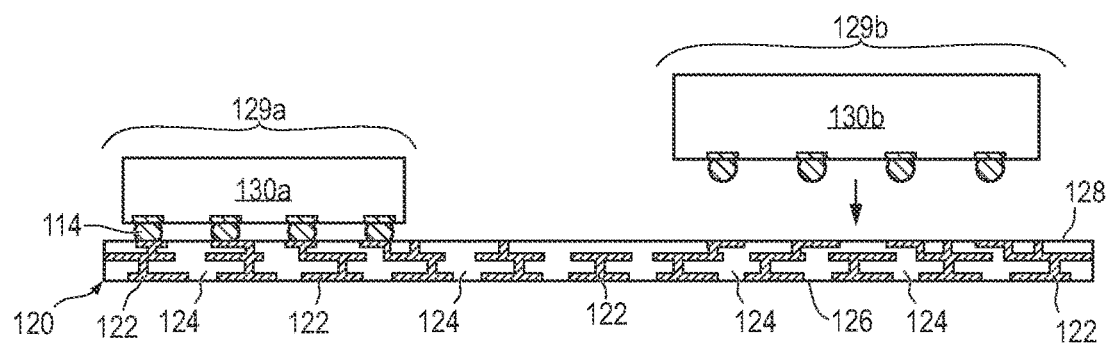
Figure 2C:
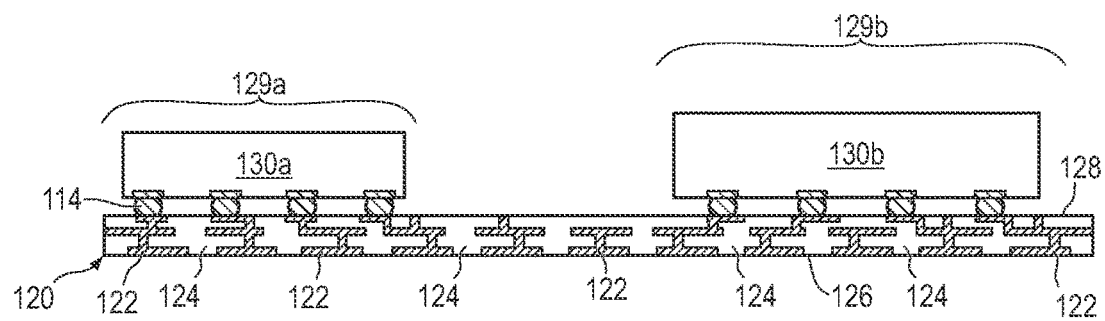

In FIG. 2b, a plurality of electrical components 130a-130b is mounted to surface 128 of interconnect substrate 120 and electrically and mechanically connected to conductive layers 122. Electrical components 130a-130b are each positioned over substrate 120 using a pick and place operation. For example, electrical component 130a and 130b can be semiconductor die 104 from FIG. 1c with active surface 110 and bumps 114 oriented toward surface 128 of substrate 120 over component attach areas 129a and 129b. Alternatively, electrical components 130a-130b can include other semiconductor die, semiconductor packages, surface mount devices, power amplifier, discrete electrical devices, or IPDs, such as a resistor, capacitor, and inductor. FIG. 2c illustrates electrical components 130a-130b electrically and mechanically connected to conductive layers 122 of substrate 120.

Figure 2D:
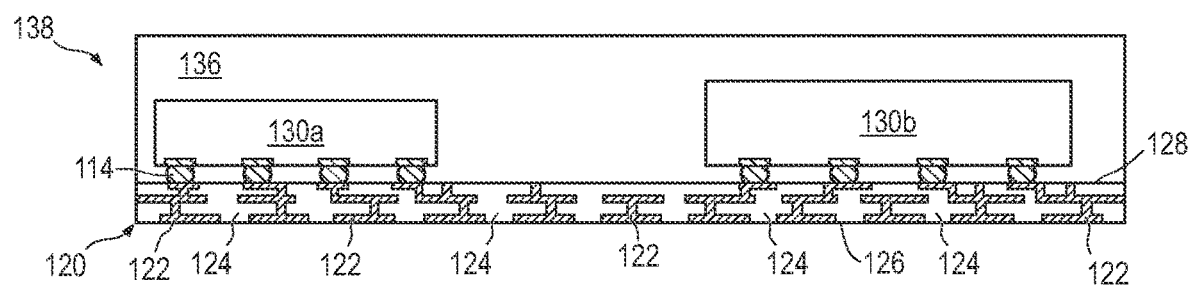

In FIG. 2d, an encapsulant or molding compound 136 is deposited over and around electric components 130a-130b and substrate 120 using a paste printing, compressive molding, transfer molding, liquid encapsulant molding, vacuum lamination, spin coating, or other suitable applicator. Encapsulant 136 can be polymer composite material, such as epoxy resin with filler, epoxy acrylate with filler, or polymer with proper filler. Encapsulant 136 is non-conductive, provides structural support, and environmentally protects the semiconductor device from external elements and contaminants. Electrical components 130a-130b as mounted to interconnect substrate 120 and covered by encapsulant 136 constitute SIP module 138.

Figure 2E:
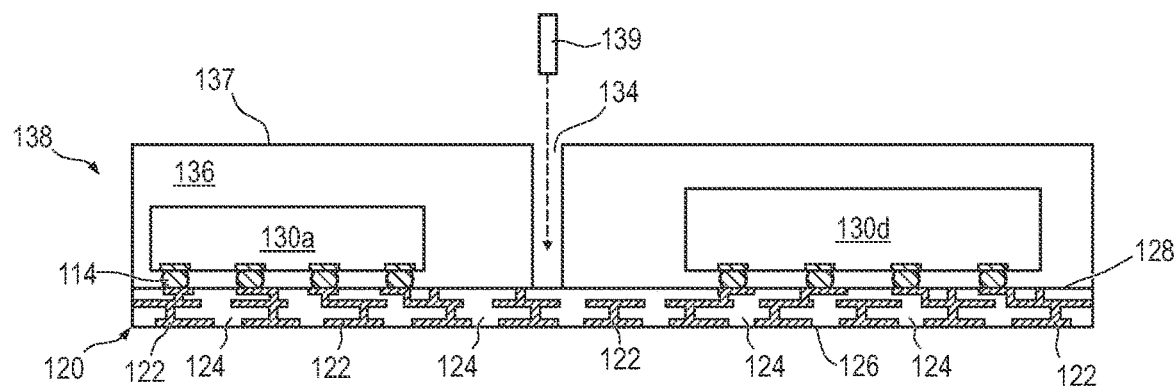
Figure 2F:
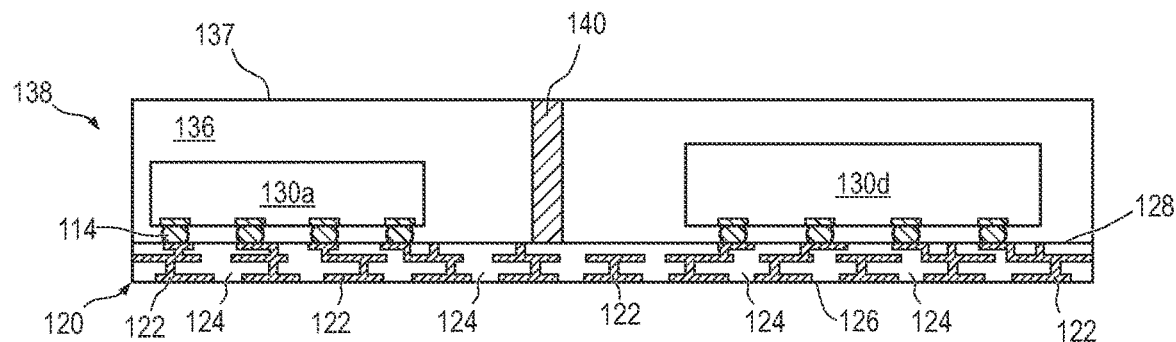

In FIG. 2e, a plurality of vias 134 is formed into surface 137 of encapsulant 136 using etching, drilling, or laser direct ablation (LDA) with laser 139. Vias 134 are aligned with and extend to portions of conductive layer 122 on interconnect substrate 120. In FIG. 2f, vias 134 are filled with Al, Cu, Sn, Ni, Au, Ag, Ti, W, poly-silicon, or other suitable electrically conductive material using paste printing and reflow, electrolytic plating, electroless plating process, or other suitable metal deposition process to form z-direction vertical conductive posts 140. Conductive posts 140 are electrically connected to conductive layer 122. Conductive posts 140 can be formed over conductive layer 122 of substrate 120 prior to encapsulant 136. In this case, encapsulant 136 would be deposited over conductive posts 140.

Electrical components 130a-130b may contain IPDs that are susceptible to or generate EMI, RFI, harmonic distortion, and inter-device interference. For example, the IPDs contained within electrical components 130a-130b provide the electrical characteristics needed for high-frequency applications, such as resonators, high-pass filters, low-pass filters, band-pass filters, symmetric Hi-Q resonant transformers, and tuning capacitors. In another embodiment, electrical components 130a-130b contain digital circuits switching at a high frequency, which could interfere with the operation of IPDs in the SIP module.

Figure 2G:
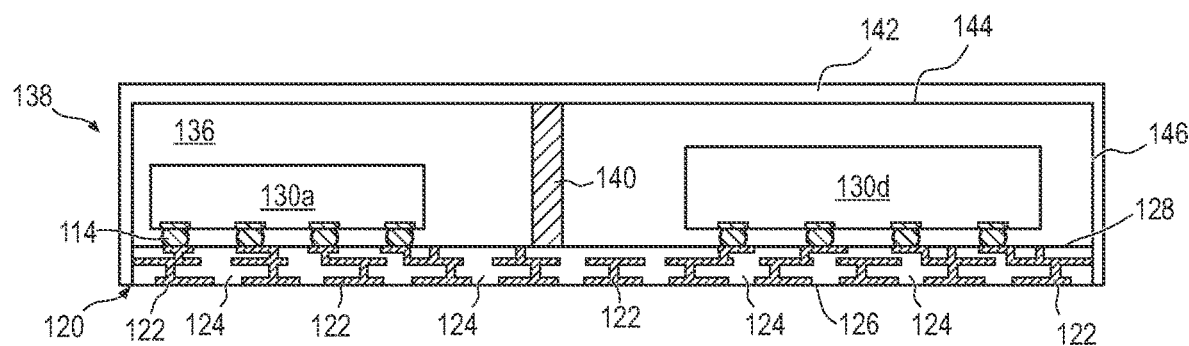

In FIG. 2g, electromagnetic shielding layer 142 is formed or disposed over surface 144 of encapsulant 136 by conformal application of shielding material. Shielding layer 142 can be one or more layers of Al, Cu, Sn, Ni, Au, Ag, or other suitable conductive material. Alternatively, shielding layer 142 can be carbonyl iron, stainless steel, nickel silver, low-carbon steel, silicon-iron steel, foil, conductive resin, carbon-black, aluminum flake, and other metals and composites capable of reducing or inhibiting the effects of EMI, RFI, and other inter-device interference. In addition, shielding layer 142 covers side surfaces 146 of encapsulant 136, as well as the side surface of substrate 120.

SIP module 138 includes high speed digital and RF electrical components 130a-130b, highly integrated for small size and low height, and operating at high clock frequencies. Electromagnetic shielding layer 142 reduces or inhibits EMI, RFI, and other inter-device interference, for example as radiated by high-speed digital devices, from affecting neighboring devices within or adjacent to SIP module 138. However, a conformally applied electromagnetic shielding layer 142 by itself may not be effective against EMI loop currents within the shielding material. The EMI current loops can originate from high energy/output devices, such as a power amplifier embodied in one or more of electrical components 130a-130b. The EMI loop currents flow through electromagnetic shielding layer 142 and induce EMI, RFI, and other inter-device interference in sensitive neighboring components within or adjacent to SIP module 138.

Figure 2H:
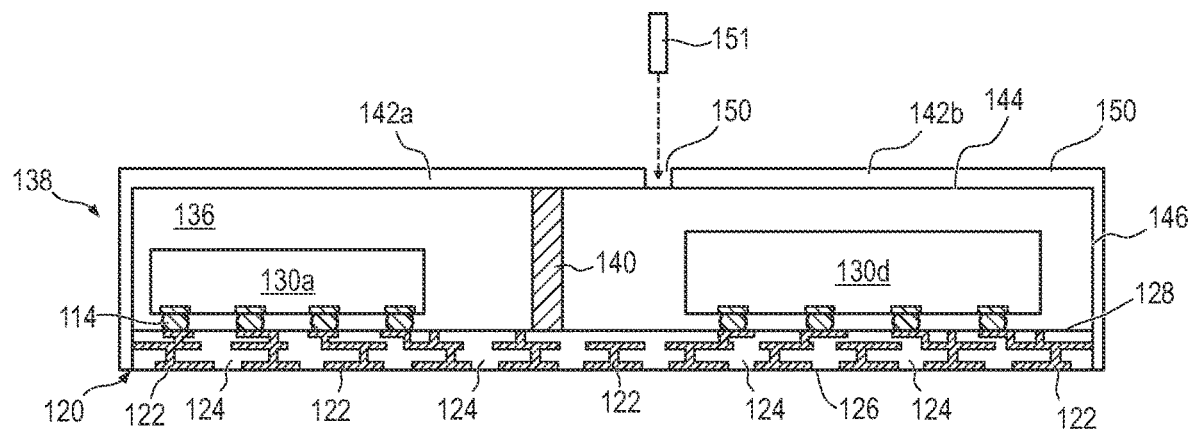
Figure 2I:
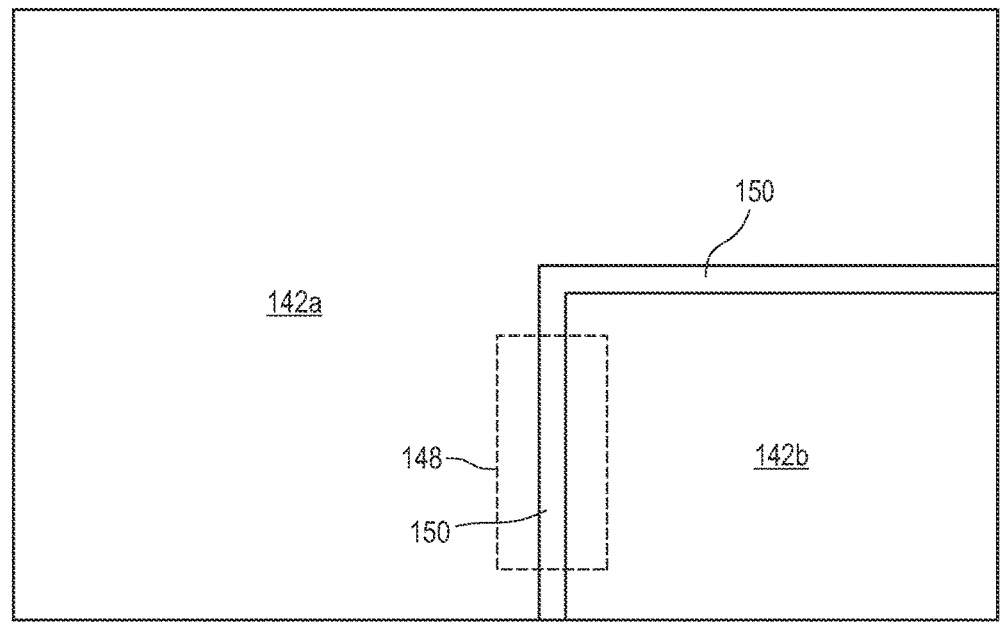

To neutralize or block these EMI loop currents, slot or channel or trench 150 is formed in electromagnetic shielding layer 142 using laser cutting or laser direct ablation (LDA) with laser 151, as shown in FIG. 2h. Slot 150 cuts completely through electromagnetic shielding layer 142 to encapsulant 136. That is, slot 150 extends at least to encapsulant 136 or extends partially into the encapsulant to cut completely through electromagnetic shielding layer 142. FIG. 2i is a top view of SIP module 138 with slot 150 formed to electrically isolate main body portion 142a from corner portion 142b of electromagnetic shielding layer 142. Slot 150 creates an electrical open or disjunction between shielding portion 142a of electromagnetic shielding layer 142 and shielding portion 142b. EMI loop currents cannot flow across slot 150 between shielding portion 142a and shielding portion 142b, or vice versa. There is no conduction path between the shielding portion 142a and shielding portion 142b. Slot 150 provides an additional layer of protection by electrically isolating shielding portion 142a from shielding portion 142b to reduce or inhibit EMI, RFI, and other inter-device interference in sensitive neighboring components within or adjacent to SIP module 138.

Figure 2J:
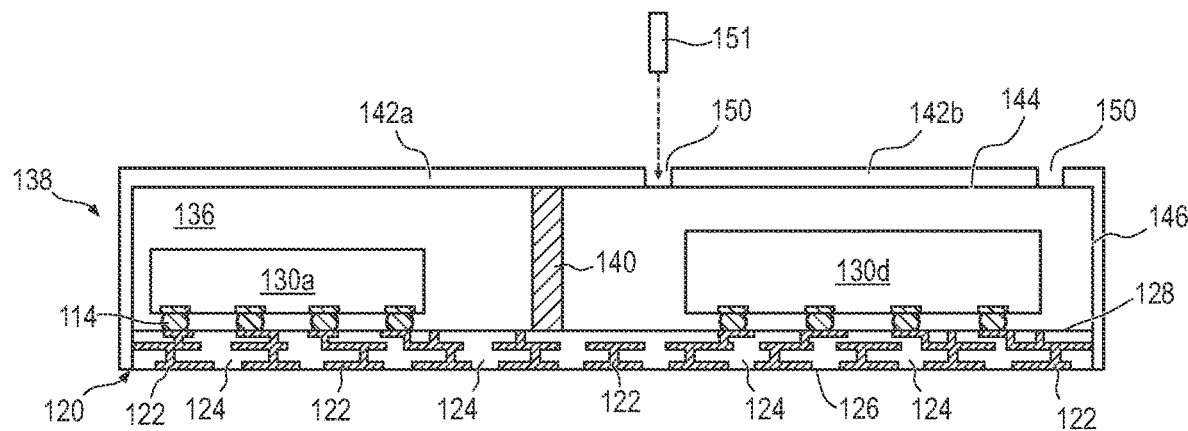
Figure 2K:
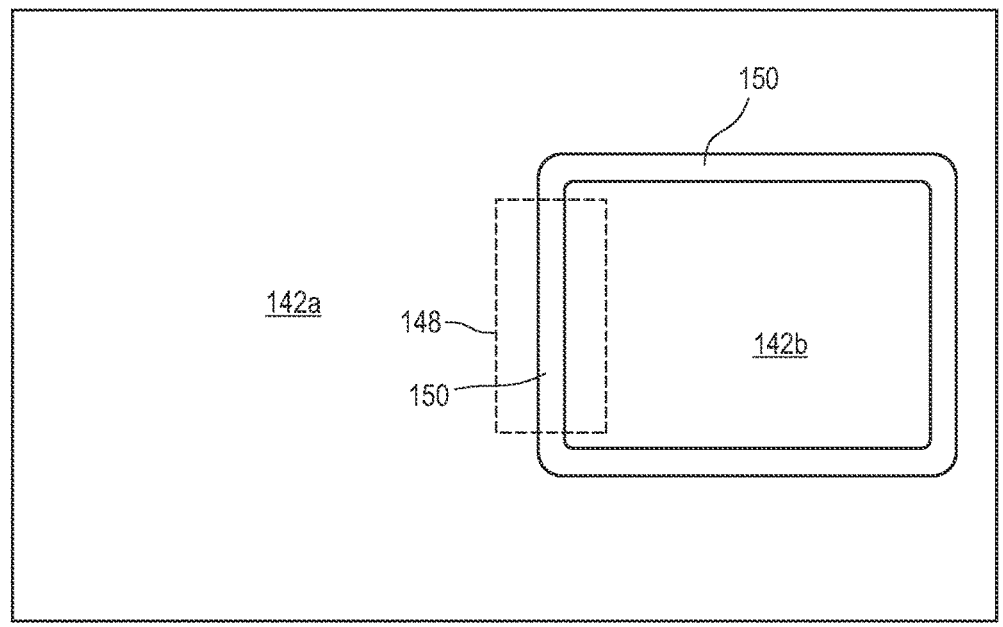

In another embodiment, slot or channel or trench 150 is formed as a continuous loop in electromagnetic shielding layer 142 using laser cutting or LDA with laser 151, as shown in FIG. 2j. Slot 150 cuts completely through electromagnetic shielding layer 142 to encapsulant 136. That is, slot 150 extends at least to encapsulant 136 or extends partially into the encapsulant to cut completely through electromagnetic shielding layer 142. FIG. 2k is a top view of SIP module 138 with slot 150 formed to electrically isolate main body portion 142a from interior island portion 142b of electromagnetic shielding layer 142. Slot 150 creates an electrical open or disjunction between shielding portion 142a of electromagnetic shielding layer 142 and shielding portion 142b. EMI loop currents cannot flow across slot 150 between shielding portion 142a and shielding portion 142b, or vice versa. There is no conduction path between the shielding portion 142a and shielding portion 142b. Slot 150 provides an additional layer of protection by electrically isolating shielding portion 142a from shielding portion 142b to reduce or inhibit EMI, RFI, and other inter-device interference in sensitive neighboring components within or adjacent to SIP module 138.

Figure 3C:
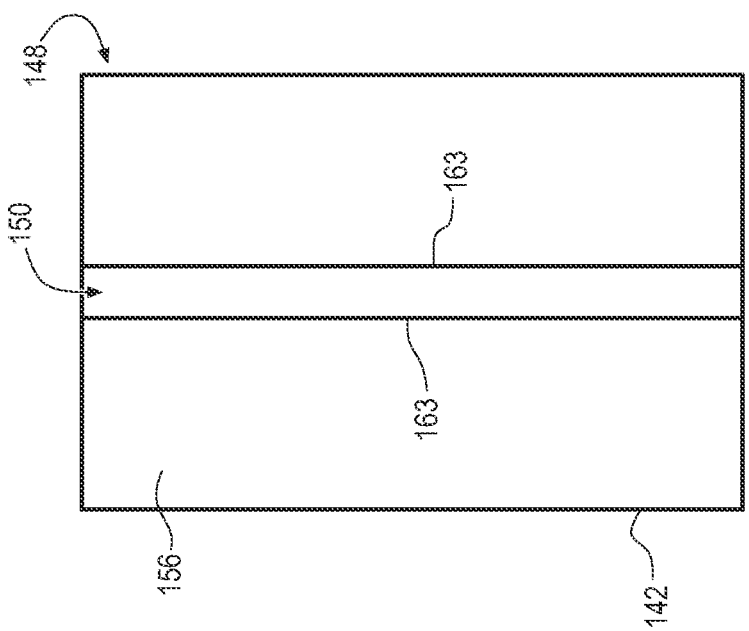
Figure 3B:
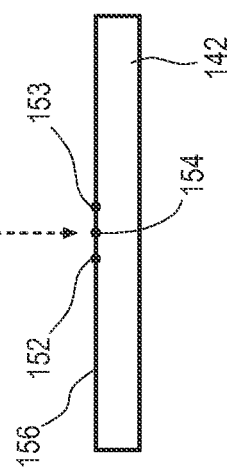
Figure 3A:
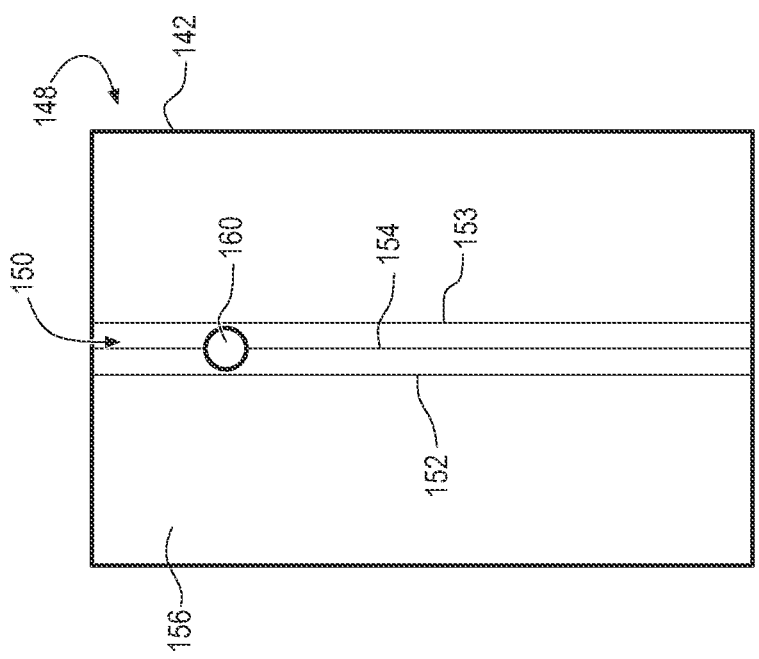

FIG. 3a illustrates a portion 148 of electromagnetic shielding layer 142 showing formation of slot 150, or at least a portion of slot 150. Slot lines 152, 153, and 154 define a location where slot 150 is to be formed in electromagnetic shielding layer 142. Slot lines 152-154 are marked, imprinted, or projected on surface 156 of electromagnetic shielding layer 142 for slot 150. Slot line 152 is the right boundary, slot line 153 is the left boundary, and slot line 154 is the centerline. Slot lines 152-154, as marked, imprinted, or projected on surface 156, serve as guides for laser beam 160 originating from laser 162, as shown in FIG. 3b. Laser 162 is focused on slot lines 152-154 so that laser beam 160 tracks with a clearly defined right boundary slot line 152, left boundary slot line 153, and centerline slot line 154. Laser beam 160 cuts or forms slot 150 along slot lines 152-154. Multiple slot lines 152-154 provide focus for laser 162 to control slot width, slot depth, and slot edge quality, which are important to neutralize or block the EMI loop current flow through electromagnetic shielding layer 142 and reduce or inhibit EMI, RFI, and other inter-device interference in sensitive neighboring components within or adjacent to SIP module 138. FIG. 3c shows slot 150 with slot edges 163 cut into surface 156 of electromagnetic shielding layer 142. FIG. 3d is a perspective view of slot 150 with slot edges 163 and vertical sidewalls 164 cut into surface 156 of electromagnetic shielding layer 142. FIG. 3e shows a further detail in a cross-sectional view of slot 150. By focusing laser 162 along multiple slot lines 152-154 (right boundary, left boundary, and centerline), slot 150 exhibits a uniform slot width W1 from surface 156 to slot depth Dl, distinct slot edges 163, and vertical slot sidewalls 164. In one embodiment, for electromagnetic shielding layer 142 thickness T1=4.0 micrometers (μm), the uniform slot width W1 is 58.5 μm and the slot depth Dl is 4-30 μm, i.e., slot 150 may extend into encapsulant 136. In another embodiment, for electromagnetic shielding layer 142 thickness T1=6.0 μm, the uniform slot width W1 is 58 μm and the slot depth Dl is 6-21 μm.

Figure 4:
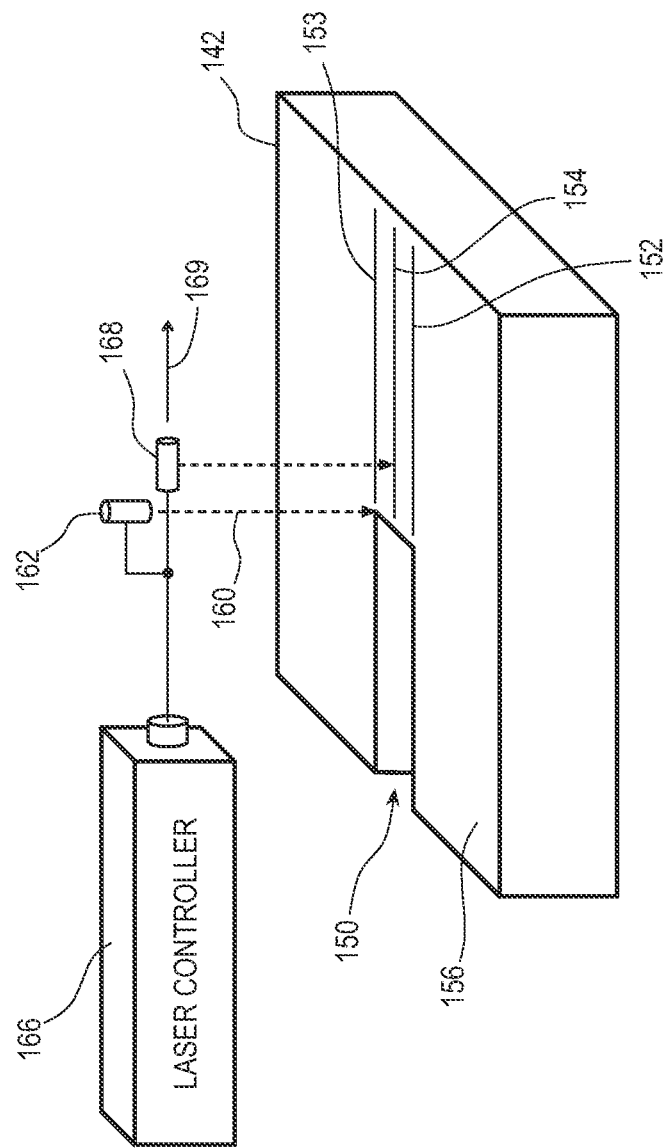
FIG. 4 illustrates the laser controller and scanner to follow the multiple slot lines to guide the laser.

FIG. 4 illustrates further detail of the laser scanning operation for FIGS. 3a-3e. Scanner 168 reads slot lines 152-154 and provides directional data to laser controller 166. Laser controller 166 receive directional data from scanner 168 tracking slot lines 152-154. The directional data from scanner 168 is used by laser controller 166 to control laser 162 to track along slot lines 152-154 (right boundary, left boundary, centerline, respectively) and cut slot 150 in the direction of arrow 169.

The number of slot lines and beam width overlap depends on slot width W1. There may be more than 3 slot lines or less than 3 slot lines. A wider slot width W1 generally involves more slot lines, while a narrower slot width W1 uses fewer slot lines.

Figure 5C:
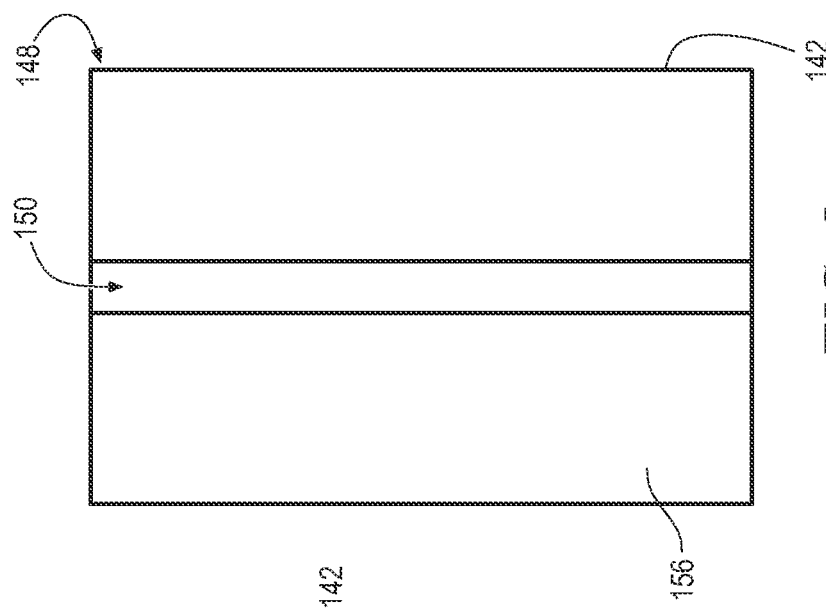
FIGS. 5a-5c illustrate another process of forming a slot in the surface of the electromagnetic shielding layer using multiple slot lines to guide a laser.
Figure 5B:
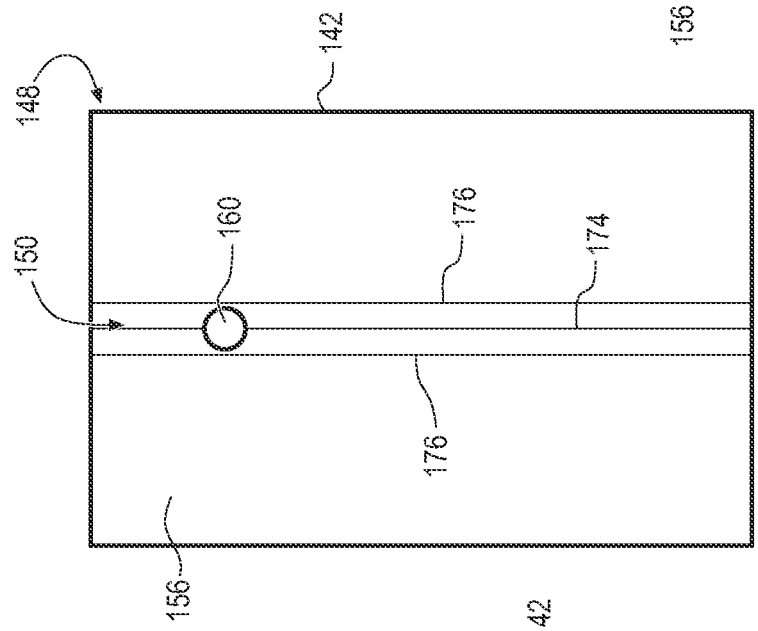
Figure 5A:
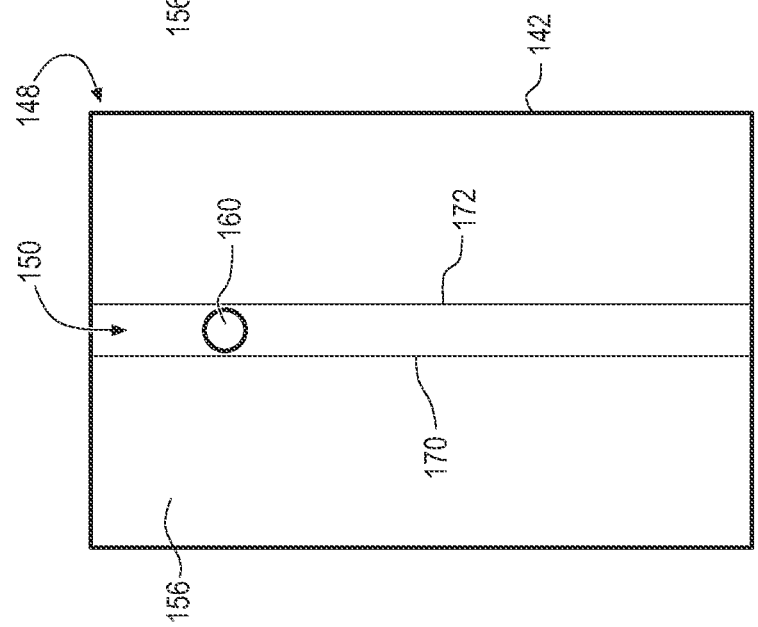

FIG. 5a illustrates another embodiment of cutting slot 150 in portion 148 of electromagnetic shielding layer 142. Slot lines 170 and 172 define a location where slot 150 is to be formed in electromagnetic shielding layer 142. Slot lines 170-172 are marked, imprinted, or projected on surface 156 of electromagnetic shielding layer 142 for slot 150. Slot line 170 is the right boundary and slot line 172 is the left boundary. Slot lines 170-172, as marked, imprinted, or projected on surface 156, serve as guides for laser beam 160 originating from laser 162. Laser 162 is focused on slot lines 170-172 so that laser beam 160 tracks with a clearly defined right boundary 170 and left boundary 172. Laser beam 160 forms an edge cut 176 for slot 150 along slot lines 170-172. Next, slot lines 174 are marked, imprinted, or projected on surface 156 of electromagnetic shielding layer 142 for slot 150, as shown in FIG. 5b. Slot line 174 is the centerline of edge cuts 176. Slot lines 174, as marked, imprinted, or projected on surface 156, serve as a guide for laser beam 160 originating from laser 162. Laser 162 projects a defocused laser beam on slot line 174 to peel back remaining electromagnetic shielding material within slot 150 along slot line 174. Multiple slot lines 170-174 provide focus for laser 162 to control slot width, slot depth, and slot edge quality, which are important to neutralize or block the EMI loop current flow through electromagnetic shielding layer 142 and reduce or inhibit EMI, RFI, and other inter-device interference in sensitive neighboring components within or adjacent to SIP module 138. FIG. 5c shows slot 150 cut into surface 156 of electromagnetic shielding layer 142.

FIGS. 6a-6b illustrate further detail of the laser scanning operation from FIGS. 5a-5c. Components having a similar function are assigned the same reference number. Scanner 168 reads slot lines 170-174 and provides directional data to laser controller 166. Laser controller 166 receives directional data from scanner 168 tracking slot lines 170-174. The directional data from scanner 168 is used by laser controller 166 to control laser 162 to track along slot lines 170 and 172 (right boundary, left boundary, respectively) during edge cut pass in the direction of arrow 169, as shown in FIG. 6a, and to track along slot line 174 (centerline) during a peel back pass from FIG. 6b, and complete the cut of slot 150 in the direction of arrow 169.

Figure 7B:
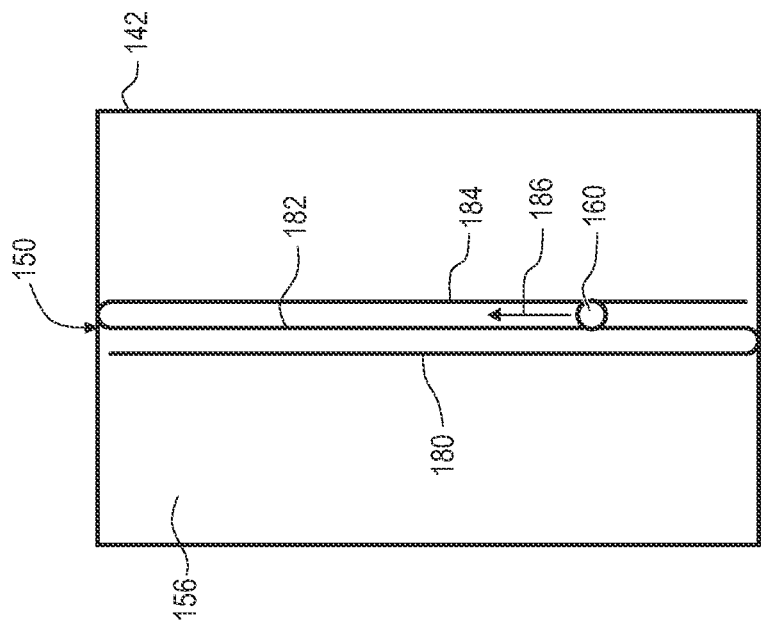
FIGS. 7a-7b illustrate yet another process of forming a slot in the surface of the electromagnetic shielding layer using multiple slot lines to guide a laser.
Figure 7A:
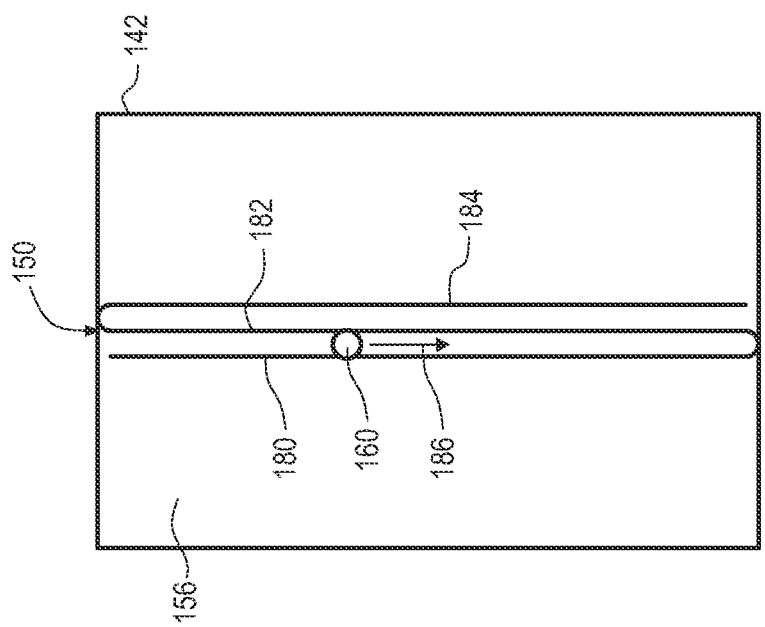

In another embodiment, slot lines 180, 182, and 184 define a location where slot 150 is to be formed in electromagnetic shielding layer 142. Slot lines 180-184 are marked, imprinted, or projected on surface 156 of electromagnetic shielding layer 142 for slot 150. In this case, laser beam 160 follows a back and forth or zig-zag pattern or path. In a first pass, laser 162 is focused to follow slot line 180 as the right boundary and slot line 182 as the left boundary in the direction of arrow 186, as shown in FIG. 7a. In a second pass, laser 162 is focused to follow slot line 182 as the left boundary and slot line 184 as the right boundary in the direction of arrow 188 opposite the direction of arrow 186, as shown in FIG. 7b. Slot lines 180-184, as marked, imprinted, or projected on surface 156, serve as guides for laser beam 160 originating from laser 162. Laser 162 is focused on slot lines 180-184 so that laser beam 160 tracks in a zig-zag pattern, cutting back and forth in opposing directions, with clearly defined left boundary and right boundary on each pass. Laser beam 160 cuts or forms slot 150 along slot lines 180-184, similar to FIG. 4. Multiple slot lines 180-184 provide focus for laser 162 to control slot width, slot depth, and slot edge quality, which are important to neutralize or block the EMI loop current flow through electromagnetic shielding layer 142 and reduce or inhibit EMI, RFI, and other inter-device interference in sensitive neighboring components within or adjacent to SIP module 138.

Figure 8:
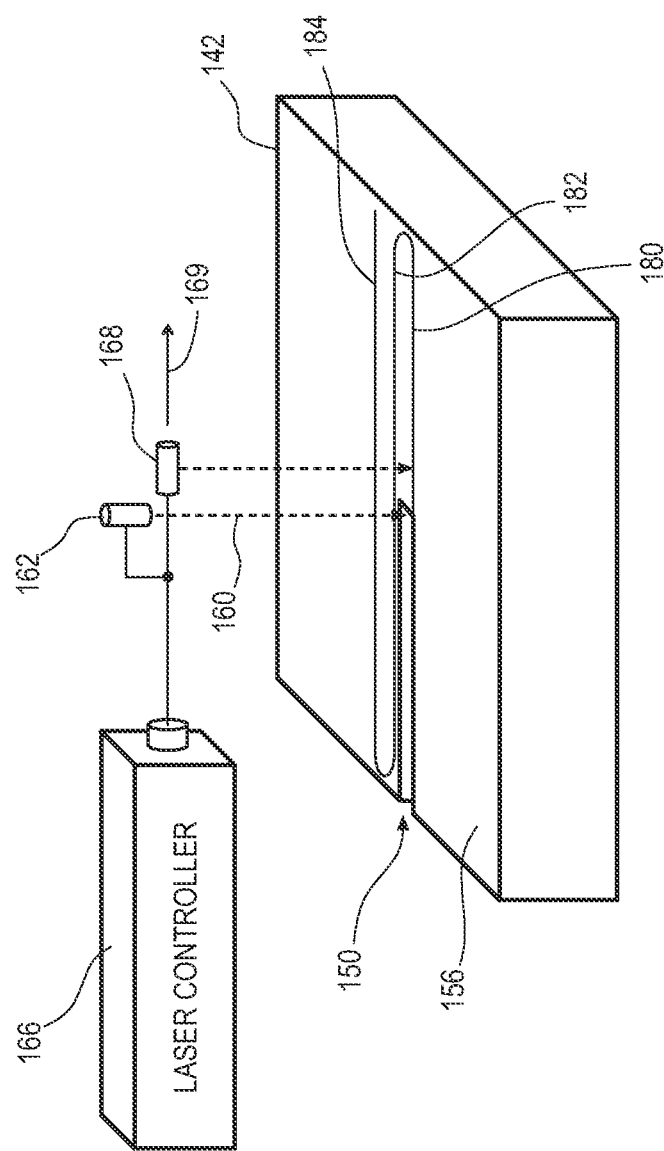
FIG. 8 illustrates the laser controller and scanner to follow the multiple slot lines to guide the laser.

FIG. 8 illustrates further detail of the laser scanning operation for FIGS. 7a-7b. Scanner 168 reads slot lines 180-184 and provides directional data to laser controller 166. Laser controller 166 receives directional data from scanner 168 tracking slot lines 180-184. The directional data from scanner 168 is used by laser controller 166 to control laser 162 to track along slot lines 180-182 (right boundary, left boundary) during the first pass in the direction of arrow 169 from FIG. 7a, and to track along slot lines 182-184 (left boundary, right boundary) during the second pass from FIG. 7b, and cut slot 150.

Figure 9:
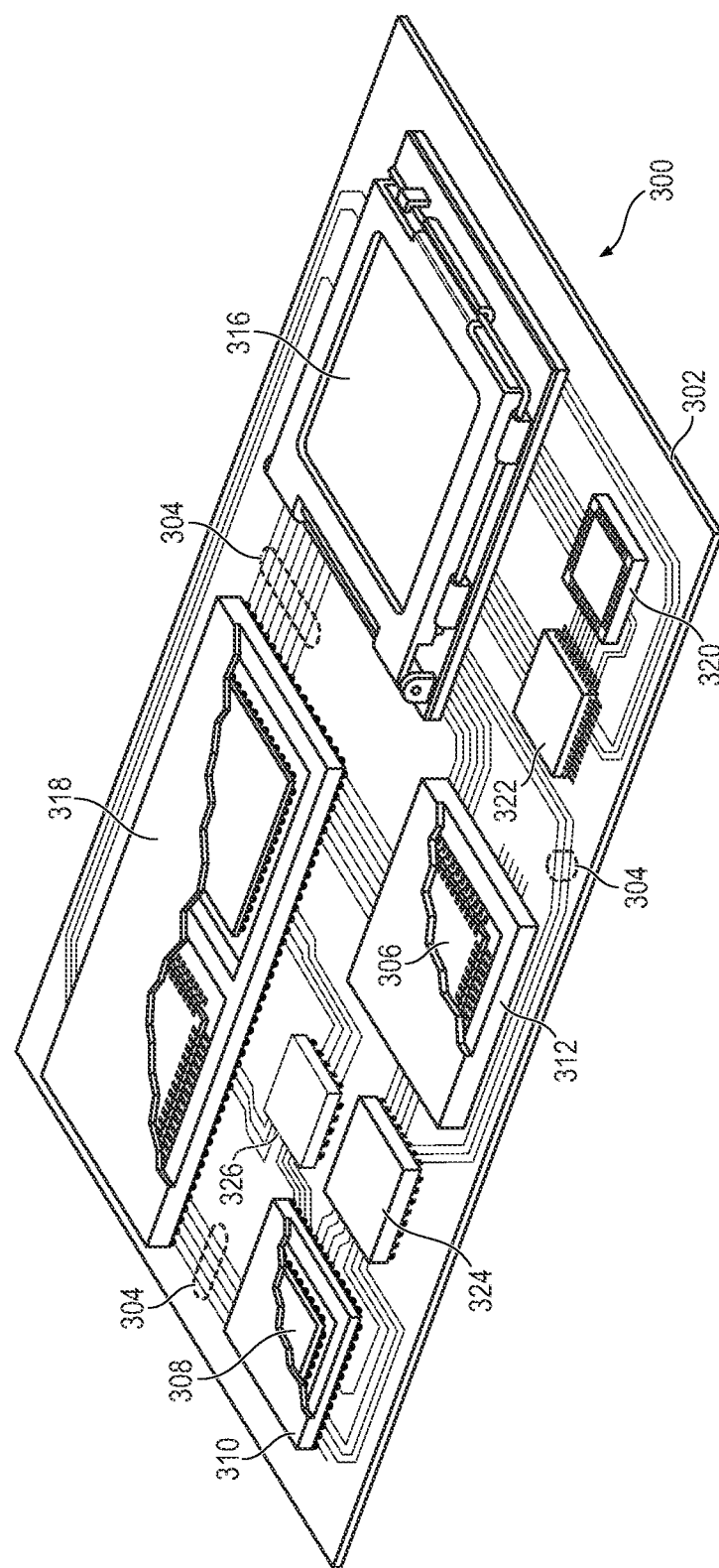
FIG. 9 illustrates a printed circuit board (PCB) with different types of packages mounted to a surface of the PCB.

FIG. 9 illustrates electronic device 300 having a chip carrier substrate or PCB 302 with a plurality of semiconductor packages mounted on a surface of PCB 302, including SIP module 138. Electronic device 300 can have one type of semiconductor package, or multiple types of semiconductor packages, depending on the application.

Electronic device 300 can be a stand-alone system that uses the semiconductor packages to perform one or more electrical functions. Alternatively, electronic device 300 can be a subcomponent of a larger system. For example, electronic device 300 can be part of a tablet, cellular phone, digital camera, communication system, or other electronic device. Alternatively, electronic device 300 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 9, PCB 302 provides a general substrate for structural support and electrical interconnect of the semiconductor packages mounted on the PCB. Conductive signal traces 304 are formed over a surface or within layers of PCB 302 using evaporation, electrolytic plating, electroless plating, screen printing, or other suitable metal deposition process. Signal traces 304 provide for electrical communication between each of the semiconductor packages, mounted components, and other external system components. Traces 304 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB.

For the purpose of illustration, several types of first level packaging, including bond wire package 306 and flipchip 308, are shown on PCB 302. Additionally, several types of second level packaging, including ball grid array (BGA) 310, bump chip carrier (BCC) 312, land grid array (LGA) 316, multi-chip module (MCM) or SIP 318, quad flat non-leaded package (QFN) 320, quad flat package 322, embedded wafer level ball grid array (eWLB) 324, and wafer level chip scale package (WLCSP) 326 are shown mounted on PCB 302. In one embodiment, eWLB 324 is a fan-out wafer level package (Fo-WLP) and WLCSP 326 is a fan-in wafer level package (Fi-WLP). Depending upon the system requirements, any combination of semiconductor packages, configured with any combination of first and second level packaging styles, as well as other electronic components, can be connected to PCB 302. In some embodiments, electronic device 300 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a stream-lined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of forming a semiconductor device, comprising:
   providing a semiconductor package;
   forming a shielding layer over the semiconductor package;
   providing a plurality of slot lines on the shielding layer defining a location to form a slot in the shielding layer; and
   forming the slot in the shielding layer by cutting at the location along the plurality of slot lines.

2. The method of claim 1, further including providing a laser to cut along the plurality of slot lines.

3. The method of claim 2, further including providing a scanner to read the plurality of slot lines and control the laser to cut along the plurality of slot lines.

4. The method of claim 1, wherein the plurality of slot lines include a left boundary slot line and a right boundary slot line.

5. The method of claim 1, wherein forming the slot in the shielding layer includes:
   performing an edge cut along the plurality of slot lines; and
   performing a peel back along a center slot line to form the slot in the shielding layer.

6. The method of claim 1, wherein forming the slot in the shielding layer includes:
   performing a first cut in a first direction along the plurality of slot lines; and
   performing a second cut in a second direction opposite the first direction along the plurality of slot lines to form the slot in the shielding layer.

7. A method of forming a semiconductor device, comprising:
   forming a shielding layer over the semiconductor device;
   providing a plurality of slot lines on the shielding layer; and
   forming a slot in the shielding layer by cutting at the location along the plurality of slot lines.

8. The method of claim 7, further including providing a laser to cut along the plurality of slot lines.

9. The method of claim 8, further including providing a scanner to read the plurality of slot lines and control the laser to cut along the plurality of slot lines.

10. The method of claim 7, wherein the plurality of slot lines include a left boundary slot line and a right boundary slot line.

11. The method of claim 7, wherein forming the slot in the shielding layer includes:
    performing an edge cut along the plurality of slot lines; and
    performing a peel back along a center slot line to form the slot in the shielding layer.

12. The method of claim 7, wherein forming the slot in the shielding layer includes:
    performing a first cut in a first direction along the plurality of slot lines; and
    performing a second cut in a second direction opposite the first direction along the plurality of slot lines to form the slot in the shielding layer.

13. The method of claim 7, wherein forming the slot in the shielding layer includes a corner edge and vertical sidewalls.

14. A semiconductor device, comprising:
    a semiconductor package; and
    a shielding layer formed over the semiconductor package with a plurality of slot lines on the shielding layer defining a location to form a slot in the shielding layer at the location along the plurality of slot lines.

15. The semiconductor device of claim 14, further including a laser to form the slot along the plurality of slot lines.

16. The semiconductor device of claim 15, further including a scanner to read the plurality of slot lines and control the laser to form the slot along the plurality of slot lines.

17. The semiconductor device of claim 14, wherein the plurality of slot lines include a left boundary slot line and a right boundary slot line.

18. The semiconductor device of claim 14, wherein the slot in the shielding layer includes:
    an edge cut along the plurality of slot lines; and
    a peel back along a center slot line to form the slot in the shielding layer.

19. The semiconductor device of claim 14, wherein the slot in the shielding layer includes:
    a first cut in a first direction along the plurality of slot lines; and
    a second cut in a second direction opposite the first direction along the plurality of slot lines to form the slot in the shielding layer.

20. A semiconductor device, comprising:
    a shielding layer formed over the semiconductor device; and
    a plurality of slot lines on the shielding layer defining a location for a slot formed in the shielding layer along the plurality of slot lines.

21. The semiconductor device of claim 20, further including a laser to form the slot along the plurality of slot lines.

22. The semiconductor device of claim 21, further including a scanner to read the plurality of slot lines and control the laser to form the slot along the plurality of slot lines.

23. The semiconductor device of claim 20, wherein the plurality of slot lines include a left boundary slot line and a right boundary slot line.

24. The semiconductor device of claim 20, wherein the slot in the shielding layer includes:
    an edge cut along the plurality of slot lines; and
    a peel back along a center slot line to form the slot in the shielding layer.

25. The semiconductor device of claim 20, wherein the slot in the shielding layer includes:
    a first cut in a first direction along the plurality of slot lines; and
    a second cut in a second direction opposite the first direction along the plurality of slot lines to form the slot in the shielding layer.

26. A semiconductor device, comprising:
    a semiconductor package; and
    a shielding layer formed over the semiconductor package with a plurality of slot lines on the shielding layer defining a location to form a slot in the shielding layer at the location defined by the plurality of slot lines.

27. The semiconductor device of claim 26, further including a laser to form the slot along the plurality of slot lines.

28. The semiconductor device of claim 27, further including a scanner to read the plurality of slot lines and control the laser to form the slot along the plurality of slot lines.

29. The semiconductor device of claim 26, wherein the plurality of slot lines include a left boundary slot line and a right boundary slot line.

30. The semiconductor device of claim 26, wherein the slot in the shielding layer includes:
    an edge cut along the plurality of slot lines; and a peel back along a center slot line to form the slot in the shielding layer.

31. The semiconductor device of claim 26, wherein the slot in the shielding layer includes:
- a first cut in a first direction along the plurality of slot lines; and
- a second cut in a second direction opposite the first direction along the plurality of slot lines to form the slot in the shielding layer.

\* \* \* \* \*